US012796412B2

(12) United States Patent
Zhang et al.

(10) Patent No.: US 12,796,412 B2
(45) Date of Patent: Nov. 10, 2026

(54) HIGH SELECTIVITY CRYOGENIC TUNGSTEN-BORON-CARBIDE ETCH

(71) Applicant: Applied Materials, Inc., Santa Clara, CA (US)

(72) Inventors: Jing Zhang, Santa Clara, CA (US); Gene Lee, San Jose, CA (US); Kenji Takeshita, Santa Clara, CA (US); Anatoli Chlenov, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 187 days.

(21) Appl. No.: 18/913,143

(22) Filed: Oct. 11, 2024

(65) Prior Publication Data

US 2025/0149337 A1 May 8, 2025

Related U.S. Application Data

(60) Provisional application No. 63/596,766, filed on Nov. 7, 2023.

(51) Int. Cl.
*H10P 76/40* (2026.01)

(52) U.S. Cl.
CPC ........ *H10P 76/4085* (2026.01); *H10P 76/405* (2026.01)

(58) Field of Classification Search
None
See application file for complete search history.

(56) References Cited

U.S. PATENT DOCUMENTS

| | | | | |
|---|---|---|---|---|
| 11,062,897 | B2 | 7/2021 | Yu et al. | |
| 2020/0066540 | A1* | 2/2020 | Hudson | H10P 50/283 |
| 2020/0332414 | A1* | 10/2020 | Guo | C23C 16/042 |
| 2021/0384039 | A1* | 12/2021 | Hoshi | H10P 50/283 |
| 2022/0123115 | A1 | 4/2022 | Chou et al. | |
| 2023/0187234 | A1 | 6/2023 | Kanarik et al. | |
| 2023/0317463 | A1 | 10/2023 | Nittala et al. | |

FOREIGN PATENT DOCUMENTS

WO 2018144198 A1 8/2018

OTHER PUBLICATIONS

International Search Report and Written Opinion dated Jan. 14, 2025 for Application No. PCT/US2024/050961.

* cited by examiner

*Primary Examiner* — Roberts P Culbert
(74) *Attorney, Agent, or Firm* — Patterson + Sheridan, LLP

(57) ABSTRACT

A method of selectively etching a hardmask layer formed on a device substrate. The method includes supplying an etching gas mixture to a process region of a processing chamber, where a device substrate is disposed in the process region when the etching gas mixture is supplied to the process region, where the device substrate may include a substrate, at least one cavity formed in the substrate, and a hardmask layer formed over the at least one cavity and over the substrate. The method also includes providing radio frequency (rf) power to the etching gas mixture to form a plasma in the process region.

15 Claims, 5 Drawing Sheets

HIGH SELECTIVITY CRYOGENIC TUNGSTEN-BORON-CARBIDE ETCH

CROSS-REFERENCE TO RELATED APPLICATIONS

This application claims priority to U.S. Provisional Application Ser. No. 63/596,766 filed Nov. 7, 2023, which is herein incorporated by reference in its entirety.

BACKGROUND

Field

Embodiments of the present disclosure generally relate an apparatus and method of substrate processing, and more specifically to an improved method of selective cryogenic etching.

Description of the Related Art

Electronic devices, such as flat panel displays, and integrated circuits, are commonly fabricated by a series of processes in which layers are deposited on a substrate and the deposited material is etched into desired patterns. The processes commonly include physical vapor deposition (PVD), chemical vapor deposition (CVD), plasma enhanced CVD (PECVD), and other plasma processing. Specifically, a plasma process includes supplying a process gas mixture to a vacuum chamber, and applying radio frequency power (RF power) to excite the process gas into a plasma state. The RF power can be inductively coupled, or capacitively coupled, to the plasma. The plasma disassociates the gas mixture into ion species and/or radicals that interface with the substrate to perform the desired deposition or etch processes.

The demands for greater integrated circuit densities also impose demands on the process sequences used in the manufacturing of integrated circuit components. For example, dynamic random-access-memory (DRAM), a nearly ubiquitous integrated circuit component. As the physical dimensions of the structures used to form semiconductor devices are pushed against technology limits, the process of accurate pattern transfer for structures that have smaller critical dimensions and higher aspect ratios has become increasingly difficult. For example, a dry plasma etching process is typically performed to form an interconnect structure that includes features with small critical dimensions and high aspect ratios. However, current dry plasma etching processes are primarily performed by physical sputtering, which results in low selectivity between the underlying layer(s) (e.g., metal layer) and the hardmask layer used during the etching process. Typically, the hardmask layer is patterned to remove a portion of the hardmask layer to expose an underlying material layer for subsequent processing. Conventional processes for patterning the hardmask layer over a metal layer often have poor etching stop control and low selectivity, which can result in damaging the metal structure disposed under the hardmask layer. Additionally, as the hardmask layer may sometimes be fabricated from a metal-containing material, which may have similar material properties to the layer disposed underneath, accurate control of the etching stopping point and etch selectivity becomes increasingly more challenging. Additionally, selectivity to the patterning layer(s) used to etch into the hardmask is also becoming increasingly more challenging. Furthermore, traditional methods for etching a hardmask layer generally uses aggressive halogen chemistries or oxidizing chemistries, which contaminate the nearby metal layer.

As technology nodes progress, the need for increasingly selective etching capabilities are paramount.

SUMMARY

Embodiments within this summary are provided to introduce a selection of concepts that are further described below in the detailed description. However, many modifications are possible without materially departing from the teachings of this disclosure. Accordingly, such modifications are intended to be included within the scope of this disclosure as defined in the claims. This summary is not intended to identify key or essential features of the claimed subject matter, nor is it intended to be used as an aid in limiting the scope of the claimed subject matter.

An aspect of the present disclosure provides a method of selectively etching a hardmask layer formed on a device substrate. The method also includes supplying an etching gas mixture to a process region of a processing chamber, where a device substrate is disposed in the process region when the etching gas mixture is supplied to the process region, where the device substrate may include: a substrate, at least one cavity formed in the substrate, and a hardmask layer formed over the at least one cavity and over the substrate. The method also includes the etching gas mixture may include at least a fluorine-containing gas and a hydrogen-containing gas; maintaining the device substrate at a cryogenic temperature. The method also includes providing radio frequency (RF) power to the etching gas mixture to form a plasma in the process region. The method also includes selectively etching exposed portions of the hardmask layer relative to the substrate at a ratio greater than 10:1 while in the presence of the plasma.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. Other embodiments of this aspect include corresponding computer systems, apparatus, and computer programs recorded on one or more computer storage devices, each configured to perform the actions of the methods.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
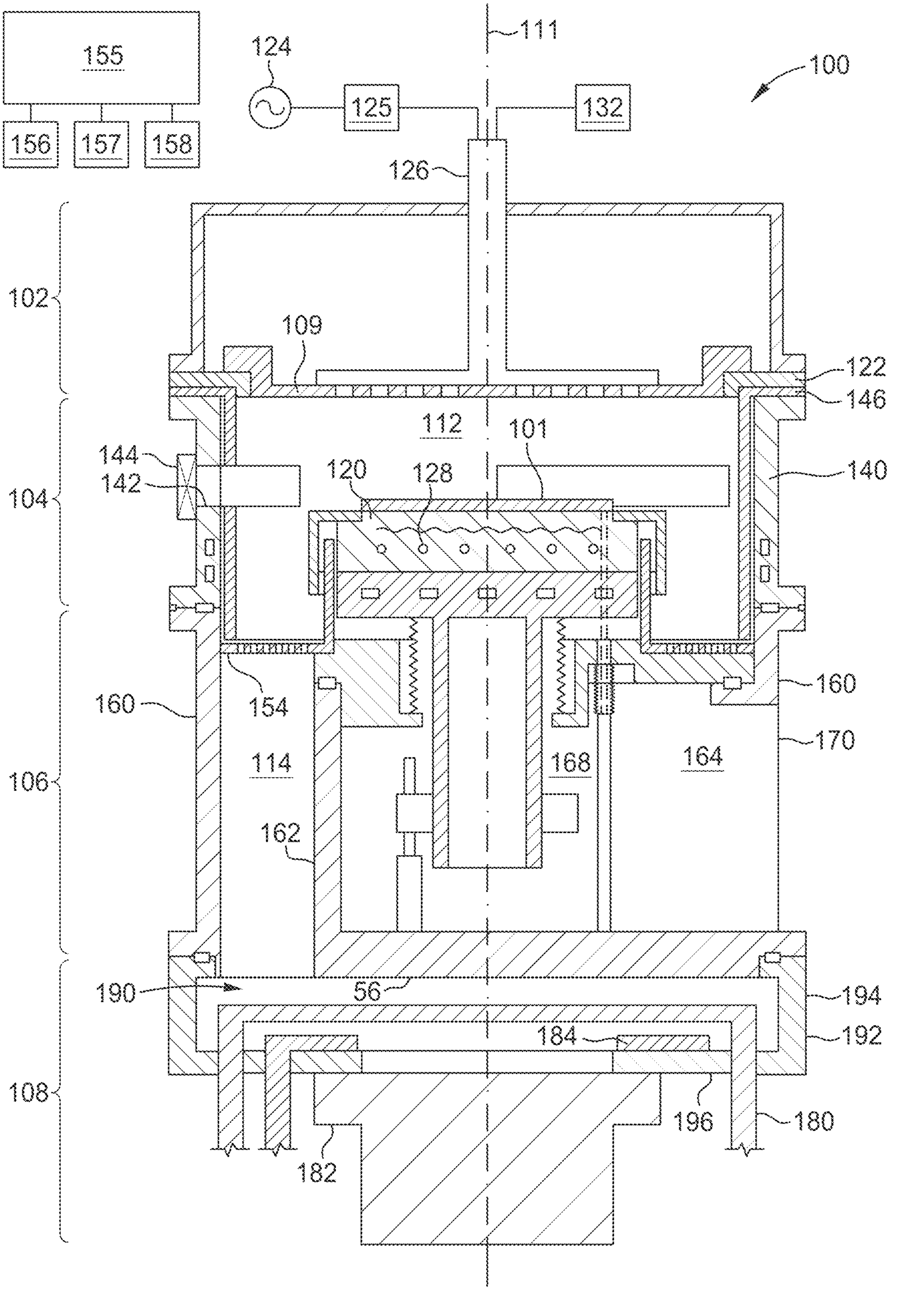
FIG. 1 is a cross sectional view of a processing chamber.

FIG. 1 is a schematic sectional view of an example of a plasma processing chamber 100. The plasma processing chamber 100 may be a plasma etch chamber, a plasma enhanced chemical vapor deposition chamber, a physical vapor deposition chamber, a plasma treatment chamber, an ion implantation chamber, or other suitable vacuum processing chamber.

The plasma processing chamber 100 may be assembled from multiple modules. The modular design enables the plasma processing chamber to meet various process requirements. As shown in FIG. 1, the plasma processing chamber 100 may include a source module 102, a process module 104, a flow module 106, an exhaust module 108, and a system controller 155.

During operation, a substrate 101 may be positioned and held on an electrostatic chuck assembly 120 and exposed to a process environment, such as plasma generated in a process region 112. Exemplary processes which may be performed in the plasma processing chamber 100 may include etching, chemical vapor deposition, physical vapor deposition, implantation, plasma annealing, plasma treating, abatement, or other plasma processes. Vacuum may be maintained in the process region 112 by suction from the exhaust module 108 through evacuation channels 114 defined by the flow module. The process region 112 and the evacuation channels 114 are substantially symmetric about a central axis 111 to provide symmetrical electrical current, gas flow, and thermal profile to establish uniform process conditions.

In one embodiment, as shown in FIG. 1, the source module may 102 may be a capacitively coupled plasma source configured to generate one or more plasmas, at least one of which may be considered a remote plasma and one of which may be considered a direct plasma. The source module 102 may include plate stack 109, which may function as an electrode (e.g., an anode), isolated and supported by the process module 104 by an isolator 122. The plate stack 109 may include various showerheads, diffusers, and screen/blocker plates arranged in a stacked orientation. The plate stack 109 may be connected to a gas source 132 through a gas inlet tube 126. The gas source may be may be configured to provide an etching gas to the process region 112. In other embodiments, the gas source may be configured to provide an etching gas mixture to the process region. The etching gas mixture can include a ratio of a fluorine-containing gas, an oxygen-containing gas, a silicon-containing gas, or combination thereof. For example, the etching gas mixture includes a ratio of a fluorine-containing gas to a hydrogen containing gas of about 1:1.4. For example, the etching gas mixture includes a ratio of a fluorine-containing gas to a hydrogen containing gas is about 1:2. For example, the etching gas mixture includes a ratio of a fluorine-containing gas to a hydrogen containing gas is about 1:3. For example, the etching gas mixture includes a ratio of a fluorine-containing gas to a hydrogen containing gas is about 1:5. In some embodiments, the etching gas mixture can additionally include a chlorine-containing gas ($Cl_2$), a hydrogen containing gas (e.g. diatomic hydrogen ($H_2$)) a nitrogen-containing gas ($N_2$), a carrier gas (e.g., helium (He), neon (Ne), argon (Ar), etc.) or combination thereof. The fluorine-containing gas can include a gas such as nitrogen trifluoride ($NF_3$), sulfur hexafluoride ($SF_6$), or other useful fluorine-containing gases. In some embodiments, the silicon-containing gas can include silicon tetrachloride ($SiC_4$), silicon tetrafluoride ($SiF_4$), silane ($SiH_4$), disilane ($Si_2H_6$), or another silicon containing gas.

The plate stack 109 and the gas inlet tube 126 may be all fabricated from a radio frequency (RF) conductive material, such as aluminum or stainless steel. The plate stack 109 may be coupled to an RF power source 124 via the gas inlet tube 126. The RF power source can supply RF power between about 50 Watts to greater than 3500 Watts at a frequency between about 400 KHz and about 13.56 MHz. An RF bias power can also be supplied as needed to a substrate support surface of the electrostatic chuck assembly 120. An RF matching network 125 may also be coupled to the RF power source 124. The gas inlet tube 126 may be coaxial with the central axis 111 of the plasma processing chamber 100 so that both RF power and processing gases are symmetrically provided.

The process module 104 is coupled to the source module 102. The process module 104 may include a chamber body 140 enclosing the process region 112. The chamber body 140 may be fabricated from a conductive material resistive to processing environments, such as aluminum or stainless steel. The electrostatic chuck assembly 120 may be centrally disposed within the chamber body 140 and positioned to support the substrate 101 on a substrate support surface in the process region 112 symmetrically about the central axis 111. The electrostatic chuck assembly 120 includes one or more channels 128 through which a working fluid may flow. The working fluid allows for the substrate support surface of the electrostatic chuck assembly 120, and by conduction, a substrate 101 disposed upon the substrate support surface, to be cooled to a cryogenic temperature (i.e., a temperature less than 0° C.). The working fluid may include any suitable gas or liquid, including, but not limited to, ammonia ($NH_3$), brines, hydrocarbons, chlorofluorocarbons, hydrochlorofluorocarbons, hydrofluorocarbons, hydrofluro-olefins, carbon dioxide ($CO_2$), oxygen (O), argon (Ar), fluorine (F), air, nitrogen (N), neon (Ne), hydrogen (H), helium (He), or combinations thereof. By adjusting the composition, or magnitude, of the working fluid flowing through the one or more channels 128 of the electrostatic chuck assembly 120, a substrate 101 disposed upon the substrate support surface may be cooled, and maintained, at a cryogenic substrate temperature. The cryogenic substrate temperature may be between about −10° C. to about −200° C. For example, the cryogenic substrate temperature is about −10° C. to about −80° C. For example, the cryogenic substrate temperature is about −10° C. to about −50° C. For example, the cryogenic substrate temperature is about −10° C. to about −30° C. For example, the cryogenic substrate temperature is about 15° C. to about −25° C. For example, the cryogenic substrate temperature is about −80° C. to about to about −120° C. For example, the cryogenic substrate temperature is about −90° C. to about to about −120° C.

A slit valve opening 142 may be formed through the chamber body 140 to allow passages of the substrate 101. A slit valve 144 may be disposed outside the chamber body 140 to selectively open and close the slit valve opening 142. In some examples, an upper liner assembly 146 may be disposed within an upper portion of the chamber body 140, shielding the chamber body 140 from the process environment. The upper liner assembly 146 may be constructed from a conductive, process compatible material, such as aluminum, stainless steel, ceramic, and/or yttrium (e.g., yttrium coated aluminum).

The flow module 106 is attached to the process module 104. The flow module 106 provides flow paths between the process region 112 defined in the process module 104 and the exhaust module 108. The flow module 106 also provides an interface between the substrate support assembly 118 and the atmospheric environment exterior to the plasma processing chamber 100.

The flow module 106 includes an outer wall 160, an inner wall 162, two or more pairs of radial walls 164 connecting between the inner wall 162 and the outer wall 160, and a bottom wall 166 attached to the inner wall 162 and the two or more pairs of radial walls 164. The outer wall 160 may include two or more through holes 170 formed between each pair of radial walls 164. A chassis 154 may be sealingly disposed over the inner wall 162 and the two or more pairs of radial walls 164. The through holes 170 connect an atmosphere volume 168 defined by the inner wall 162 with the exterior environment, thus accommodating utility connections, such as electrical connection, gas connection, cooling fluid connection.

The outer wall 160 of the flow module 106 is shaped to match the chamber body 140 of the process module 104. The inner wall 162, bottom wall 166, radial walls 164, and the chassis 154 divide the volume inside the outer wall 160 into the evacuation channels 114 and the atmosphere volume 168. The evacuation channels 114 connect with the process region 112 of the process module 104. The evacuation channels 114 are symmetrically defined between the radial walls 164 to connect the process region 112 and the interior volume 190.

The exhaust module 108 includes a body 192 having sidewalls 194 and a bottom 196. The sidewalls 194 and bottom 196 define an interior volume 190. The exhaust module 108 further incudes a symmetric flow valve 180, a pumping ring 184, and a vacuum pump 182. The pumping ring 184 and the symmetric flow valve 180 are disposed within the interior volume 190 of the exhaust module 108. The exhaust module 108 may be discussed in more detail in conjunction with FIGS. 2-4B. The vacuum pump 182 may be a symmetric turbo molecular pump in certain embodiments. The symmetric flow valve 180 connects to the evacuation channels 114 to provide symmetric and uniform flow in the plasma processing chamber 100.

The plasma processing chamber 100 includes a system controller 155. The controller includes a programmable central processing unit (CPU) 156 which is operable with a memory 157 (e.g., non-volatile memory) and support circuits 158. The support circuits 158 are conventionally coupled to the CPU 156 and comprise cache, clock circuits, input/output subsystems, power supplies, and the like, and combinations thereof coupled to the various components of the plasma processing chamber 100, to facilitate control thereof. The CPU 156 is one of any form of general purpose computer processor used in an industrial setting, such as a programmable logic controller (PLC), for controlling various components and sub-processors of the processing system. The memory 157, coupled to the CPU 156, is non-transitory and is typically one or more of readily available memories such as random access memory (RAM), read only memory (ROM), floppy disk drive, hard disk, or any other form of digital storage, local or remote.

Typically, the memory 157 is in the form of a non-transitory computer-readable storage media containing instructions (e.g., non-volatile memory), which when executed by the CPU 156, facilitates the operation of the plasma processing chamber 100. The instructions in the memory 157 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 155 may be used with one or any combination of the various systems described herein.

Figure 2A:
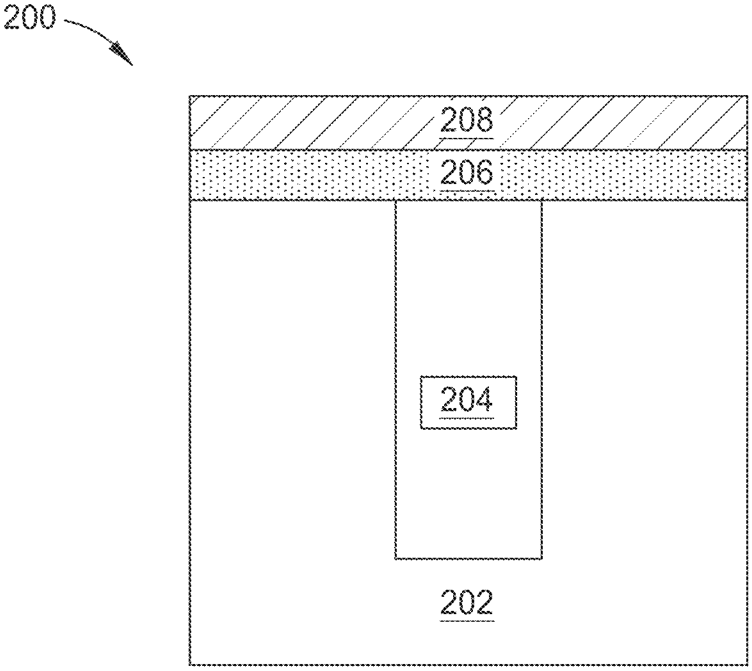
FIG. 2A is cross sectional view of a portion of a substrate.

FIG. 2A is cross sectional view of an example portion of a semiconductor structure 200 as may be encountered during substrate manufacturing and processing. The illustrated portion of the semiconductor structure 200 includes a substrate 202 forming the outer periphery of a cavity 204, a hardmask 206 disposed above the substrate 202, and filling the cavity 204. The semiconductor structure also includes one or more layers 208 over disposed over the hardmask 206 layer.

In this example, the both the substrate 202 is formed of silicon dioxide. Cavity 204, may, in subsequent processing steps, become a capacitor for a DRAM cell. In this example, the hardmask 206 is formed with a high-hardness material. For example, titanium nitride, silicon nitride, or pure boron. The hardmask 206 is typically used to stop an etching process from etching areas disposed beneath the hardmask 206 (e.g. substrate 202) while the one or more layers 208 disposed over the hardmask 206 layer are removed.

Figure 2B:
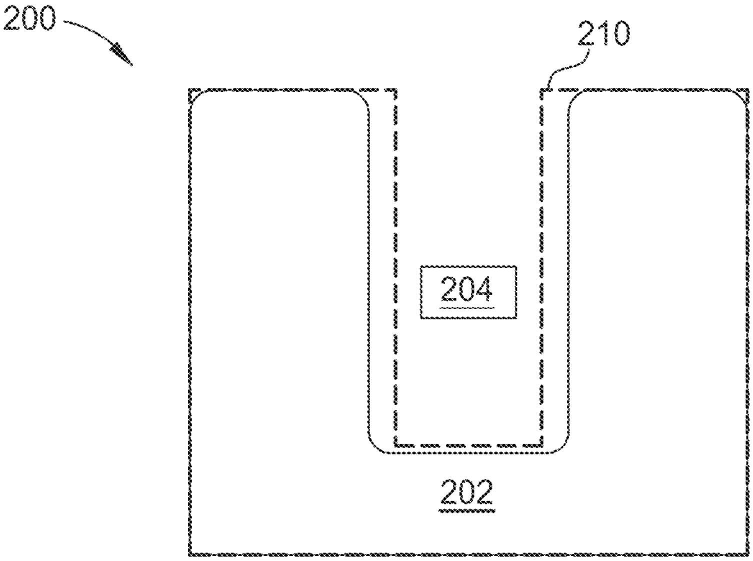
FIG. 2B is cross sectional view of a portion of a substrate, after etching.

FIG. 2B is an example cross sectional view of a portion of a semiconductor structure 200, after a conventional (e.g., non-cryogenic) etching process has taken place. The etching process has not only removed the one or more layers 208 over disposed over the hardmask 206 layer, but has also removed the hardmask 206 and has begun to etch the substrate 202, altering the geometry (210 indicates original shape of substrate 202) of the cavity 204.

The undesirable etching result shown in FIG. 2B illustrates the similar properties between the substrate 202 material and the hardmask 206 material. The undesirable etching result illustrates a low-selectivity (e.g., less than about 4) for the hardmask 206 material over the substrate 202 material, which may result in decreased device performance, reduced yields, or other negative outcomes.

Figure 3A:
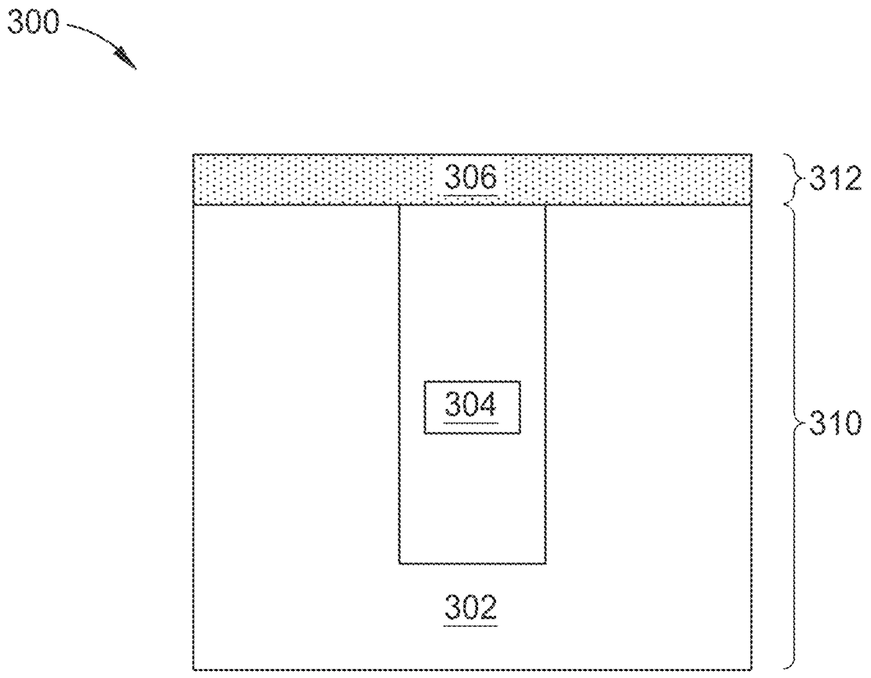
FIG. 3A is cross sectional view of a portion of a substrate, according to one embodiment described herein.

FIG. 3A is cross sectional view of a portion of a device substrate 300, according to one embodiment described herein. More specifically, FIG. 3A illustrates a portion of the device substrate 300 as may be encountered during DRAM manufacturing and processing. In other embodiments, FIG. 3A may illustrate the portion of the device substrate 300 as may be in encountered in other substrate manufacturing and processing stages.

The device substrate 300 includes a substrate 302, a cavity 304 formed in the substrate 302, and a hardmask layer 306 disposed above the substrate 202 and above the cavity 204. In other embodiments, the hardmask layer 306 may also be disposed within the cavity 204.

Substrate 302 is formed of silicon dioxide. In other embodiments, the substrate 302 can be a material, such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, silicon carbide, glass, or sapphire among other materials. Further, the substrate 302 can be a wafer, a rectangular substrate, or a square substrate. In an embodiment in which a SOI structure is used for the substrate 302, the substrate 302 can further include a buried dielectric layer disposed on a silicon crystalline substrate. In another embodiment, the substrate 302 can be a crystalline silicon substrate. In some embodiments, the substrate 302 can be a thermally oxidized substrate. The substrate 302 has a substrate thickness 310. The substrate thickness 310 is between about 2000 nanometers (nm) and about 4000 nm. For example, the substrate thickness 310 is about 3000 nm.

FIG. 3A includes a cavity 304. In practice, the device substrate may include at least one cavity 304 (e.g., a plurality of cavities). In one embodiment, the cavity 304 may be representative of a DRAM capacitor mold of a plurality of DRAM capacitor molds. In another embodiment, the cavity 304 may be representative of a high-aspect ratio (HAR) feature of a plurality of HAR features. The cavity 304 may be formed in the substrate 302 by a cryogenic etching process. In other embodiments, cavity 304 may be formed in the substrate 302 by any suitable means, for example, a plasma etching process.

Hardmask layer 306 is shown disposed over the cavity 304 and the substrate 302. The hardmask layer 306 may be disposed over the cavity 304 and the substrate 302 by any suitable process. For example, the hardmask layer 306 may be disposed over the cavity 304 and the substrate 302 by chemical vapor deposition (CVD). The hardmask layer 306 has a hardmask thickness 312. The hardmask thickness 312 is between about 200 nm and about 500 nm. For example, the hardmask thickness 312 is about 350 nm.

The hardmask layer 306 includes a tungsten-boron-carbide (WBC) material. The WBC material includes a percentage of tungsten, a percentage of boron, and a percentage of carbon (e.g. a W:B:C ratio) by weight. The percentage of tungsten in the WBC material is between about 50% to about 90%. For example, the percentage of tungsten in the WBC material is about 70%. The percentage of boron in the WBC material is between about 5% to about 20%. For example, the percentage of boron in the WBC material is about 10%. The percentage of carbon in the WBC material is between about 5% to about 30%. For example, the percentage of carbon in the WBC material is about 20%. In other embodiments, the hardmask layer 306 includes a tungsten containing material. The tungsten containing material includes a percentage of tungsten between about 50% to about 90%. For example the tungsten containing material includes a percentage of tungsten of at least about 50%.

Figure 3B:
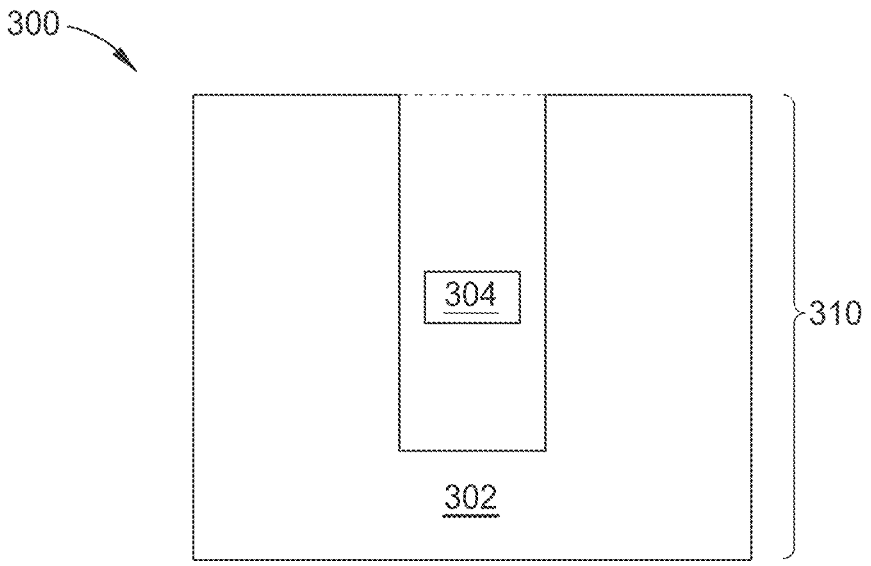
FIG. 3B is cross sectional view of a portion of a substrate, after etching, according to one embodiment described herein.

FIG. 3B is cross sectional view of a portion of a substrate, after a method of highly selective cryogenic etching, according to one embodiment described below. In contrast to FIG. 2B and the traditional, FIG. 3B illustrates the removal of the hardmask layer 306, by a highly selective cryogenic etching method, without distortion of the cavity 304.

Figure 4A:
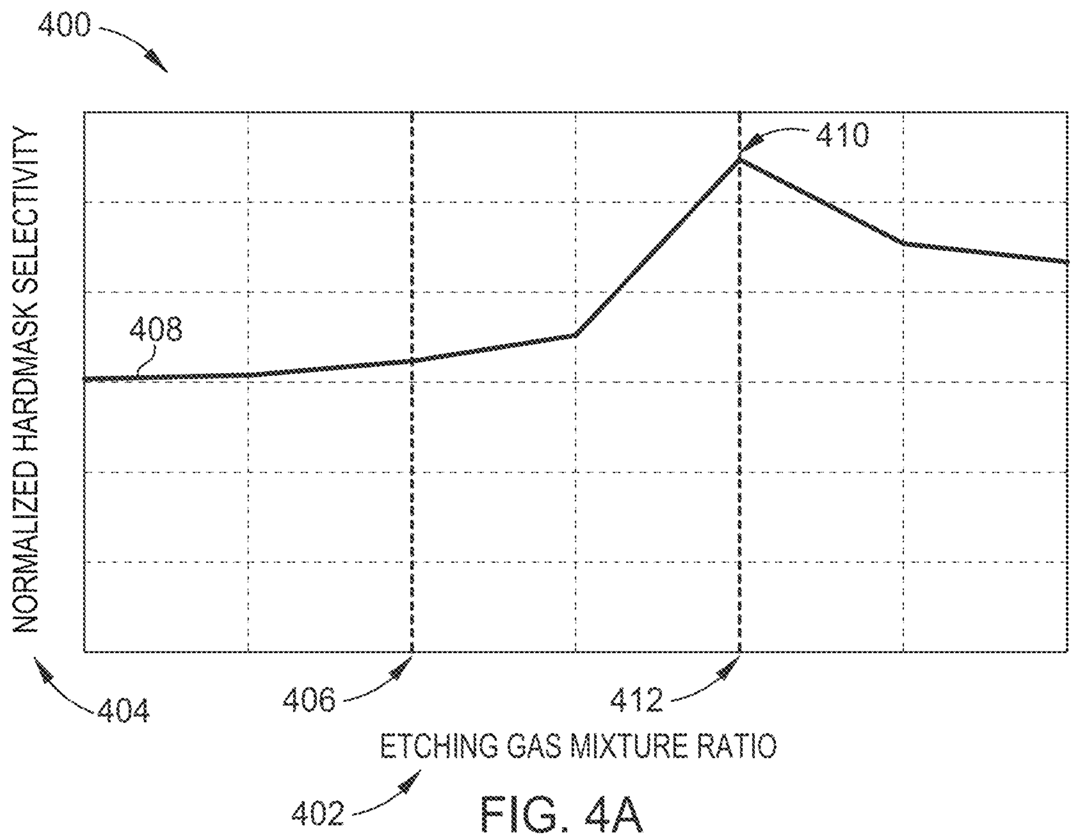
FIG. 4A is a graph plotting etching gas mixture ratios to normalized hardmask selectivity, according to one embodiment described herein.

FIG. 4A is a graph 400 plotting etching gas mixture ratios to normalized hardmask selectivity, according to one embodiment described herein. Graph 400 includes a horizontal axis 402, a vertical axis 404, and a data plot line 408 which includes a local maxima 410.

The horizontal axis 402 of graph 400 plots an etching gas mixture ratio. The etching gas mixture ratio plotted on the horizontal axis 402 is a ratio of the fluorine-containing gas to the hydrogen containing gas A dotted line 406 illustrates the point on the horizontal axis where etching gas mixture ratio is about 1:1. To the left of the dotted line 406, the fluorine-containing gas is a greater proportion of the etching gas mixture ratio than the hydrogen-containing gas. To the right of the dotted line 406, the hydrogen-containing gas is a greater proportion of the etching gas mixture ratio than the fluorine-containing gas.

The vertical axis 404 of graph 400 plots a normalized hardmask selectivity. The vertical axis 404 indicates an increase in the hardmask selectively from the bottom to the top of the vertical axis 404.

The data plot line 408 of graph 400 indicates that as the etching gas mixture ratio is adjusted from left to right on the horizontal axis 402, the hardmask selectivity generally increases until a local maxima 410 is reached and further changes to the etching gas mixture ratio past dotted line 412 generally reduces the hardmask selectivity.

Figure 4B:
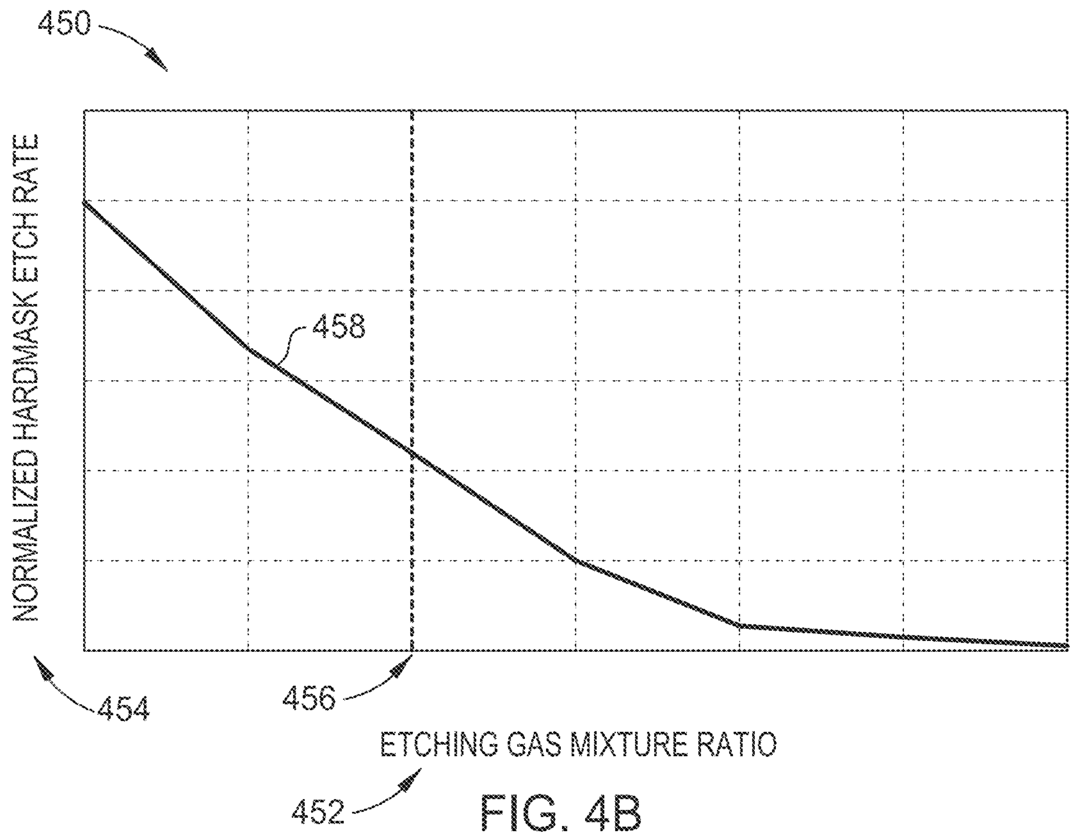
FIG. 4B is a graph plotting etching gas mixture ratios to hardmask etch rate, according to one embodiment described herein.

FIG. 4B is a graph 450 plotting etching gas mixture ratios to hardmask etch rate, according to one embodiment described herein. Graph 450 includes a horizontal axis 452, a vertical axis 454, and a data plot line 458.

The horizontal axis 452 of graph 450 plots an etching gas mixture ratio. The etching gas mixture ratio plotted on the horizontal axis 452 is a ratio of the fluorine-containing gas to the hydrogen containing gas. A dotted line 456 illustrates the point on the horizontal axis where etching gas mixture ratio is about 1:1. To the left of the dotted line 456, the fluorine-containing gas is a greater proportion of the etching gas mixture ratio than the hydrogen-containing gas. To the right of the dotted line 456, the hydrogen-containing gas is a greater proportion of the etching gas mixture ratio than the fluorine-containing gas.

The vertical axis 454 of graph 450 plots a normalized hardmask etch rate. The vertical axis 454 indicates an increase in the hardmask selectively from the bottom to the top of the vertical axis 454. The data plot line 458 of graph 450 indicates that as the etching gas mixture ratio is adjusted from left to right (e.g. a reduction of the fluorine-containing gas in proportion to the hydrogen-containing gas) on the horizontal axis 452, the hardmask etch rate generally decreases.

Figure 5:
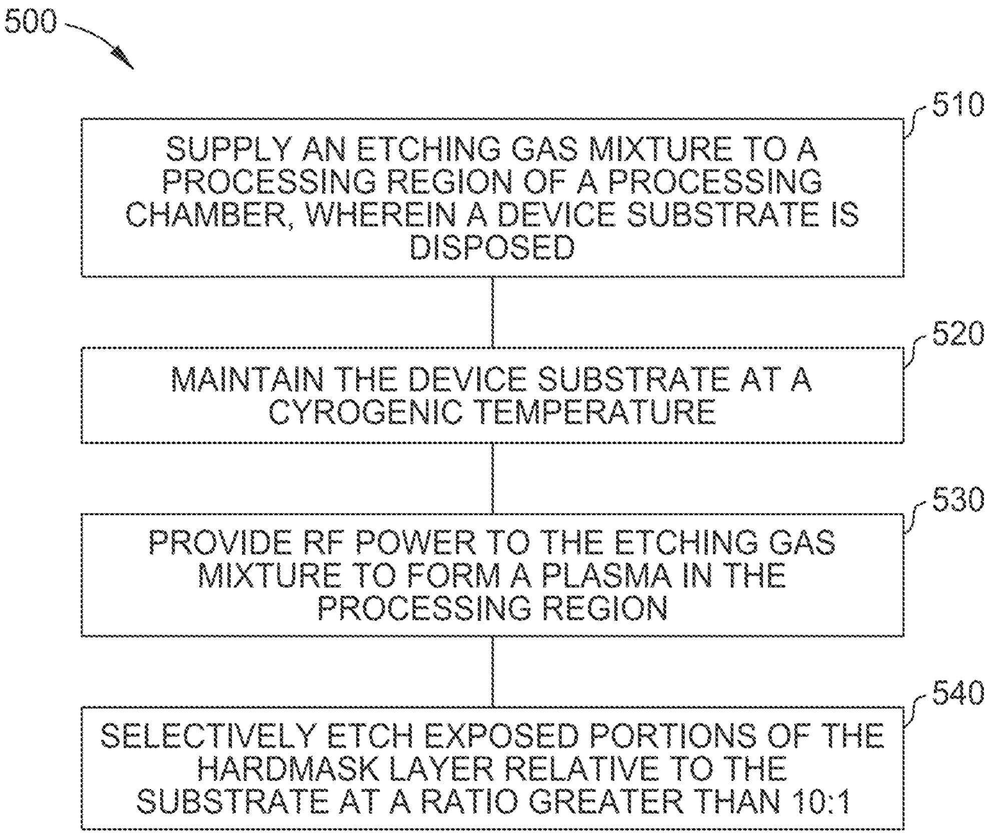
FIG. 5 is a flow diagram of a method according to one embodiment.

FIG. 5 illustrates a flow diagram for a method 500 of selectively etching a hardmask layer formed on a device substrate, according to one embodiment described herein. While the operations of method 500 are described in a linear manner in the flow diagram shown in FIG. 5. As implemented, the operations of method 500 may occur simultaneously, may occur in a different order, may overlap in time, and may be repeated individually, or as a whole.

Operation 510 of method 500 includes supplying an etching gas mixture to a process region 112 of a plasma processing chamber 100, where a device substrate 300 is disposed in the process region 112. The device substrate 300 includes a substrate 302 with at least one cavity 304 formed in the substrate. The device substrate 300 also includes a hardmask layer 306 formed over the at least one cavity 204 and over the substrate 302. The etching gas mixture includes at least a fluorine-containing gas and at least a hydrogen-containing gas.

Operation 520 of method 500 includes maintaining the device substrate 300 at a cryogenic temperature (e.g., between about −10° C. to about −200° C.) during the operations of method 500.

Operation 530 of method 500 includes providing RF power from an RF power source 124 to excite the etching gas mixture within the process region 112 of the plasma processing chamber 100 into a plasma state.

Operation 540 of method 500 includes selectively etching exposed portions of the hardmask layer relative to the substrate at a ratio greater than 10:1 while in the presence of the plasma.

While not wanting to be bound by theory, it is believed that the percentage of tungsten contained in the hardmask layer, the etching gas mixture ratio, as well as maintaining the substrate at a cryogenic temperature, allow for an improved selectivity of the plasma etching process for the exposed portions of the hardmask layer relative to the substrate at a ratio greater than about 10:1, in exchange for a reduction hardmask layer etching rate. It is further believed that the cryogenic etch rate of the silicon dioxide substrate is faster than a conventional dielectric etch, which may reduce the throughput of the etch process.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems may generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

While the various steps in an embodiment method or process are presented and described sequentially, one of ordinary skill in the art will appreciate that some or all of the steps may be executed in different order, may be combined or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Unless defined otherwise, all technical and scientific terms used have the same meaning as commonly understood by one of ordinary skill in the art to which these systems, apparatuses, methods, processes and compositions belong.

In this disclosure, the terms “top”, “bottom”, “side”, “above”, “below”, “up”, “down”, “upward”, “downward”, “horizontal”, “vertical”, and the like do not refer to absolute directions. Instead, these terms refer to directions relative to a nonspecific plane of reference. This non-specific plane of reference may be vertical, horizontal, or other angular orientation.

The singular forms “a,” “an,” and “the” include plural referents, unless the context clearly dictates otherwise. Within a claim, reference to an element in the singular is not intended to mean “one and only one” unless specifically so stated, but rather “one or more.” Unless specifically stated otherwise, the term “some” refers to one or more.

Embodiments of the present disclosure may suitably “comprise”, “consist” or “consist essentially of” the limiting features disclosed, and may be practiced in the absence of a limiting feature not disclosed. As used here and in the appended claims, the words “comprise,” “has,” and “include” and all grammatical variations thereof are each intended to have an open, non-limiting meaning that does not exclude additional elements or steps.

“Optional” and “optionally” means that the subsequently described material, event, or circumstance may or may not be present or occur. The description includes instances where the material, event, or circumstance occurs and instances where it does not occur.

As used, the term “determining” encompasses a wide variety of actions. For example, “determining” may include calculating, computing, processing, deriving, investigating, looking up, for example, looking up in a table, a database or another data structure, and ascertaining. Also, “determining” may include receiving, for example, receiving information, and accessing, for example, accessing data in a memory. Also, “determining” may include resolving, selecting, choosing, and establishing.

When the word “approximately” or “about” are used, this term may mean that there may be a variance in value of up to ±10%, of up to 5%, of up to 2%, of up to 1%, of up to 0.5%, of up to 0.1%, or up to 0.1%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as “first” and “second” are arbitrarily assigned and are merely intended to differentiate between two or more components of a system, an apparatus, or a composition. It is to be understood that the words “first” and “second” serve no other purpose and are not part of the name or description of the component, nor do they necessarily define a relative location or position of the component. Furthermore, it is to be understood that that the mere use of the term “first” and “second” does not require that there be any “third” component, although that possibility is envisioned under the scope of the various embodiments described.

As used, “a CPU,” “a processor,” “at least one processor” or “one or more processors” generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, “a memory,” “at least one memory” or “one or more memories” generally refers to a single memory configured to store data and/or instructions, multiple memories configured to collectively store data and/or instructions.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims.

What is claimed is:

1. A method of selectively etching a hardmask layer formed on a device substrate, comprising:

supplying an etching gas mixture to a process region of a processing chamber, wherein a device substrate is disposed in the process region when the etching gas mixture is supplied to the process region, wherein the device substrate comprises:

a substrate, at least one cavity formed in the substrate, and a hardmask layer formed over the at least one cavity and over the substrate; and the etching gas mixture comprises at least a fluorine-containing gas and a hydrogen-containing gas;

maintaining the device substrate at a cryogenic temperature;

delivering radio frequency (RF) power to the etching gas mixture to form a plasma in the process region; and selectively etching exposed portions of the hardmask layer relative to the substrate at a ratio greater than 10:1 while in a presence of the plasma.

2. The method of claim 1, wherein the substrate is further comprised of silicon dioxide.

3. The method of claim 1, wherein the etching gas mixture has a ratio of the fluorine-containing gas to the hydrogen-containing gas between about 5:1 to about 1:5.

4. The method of claim 3, wherein the fluorine-containing gas is nitrogen trifluoride ($NF_3$).

5. The method of claim 3, wherein the hydrogen-containing gas is a diatomic hydrogen ($H_2$).

6. The method of claim 1, wherein the hardmask layer is deposited by chemical vapor deposition.

7. The method of claim 1, wherein the hardmask layer comprises a tungsten-boron-carbide (WBC) material, wherein the WBC material further comprises at least tungsten, boron, and carbon.

8. The method of claim 7, wherein tungsten comprises between about 50% to about 90% of the WBC material by weight.

9. The method of claim 7, wherein the percentage of boron is between about 5% to about 20% of the WBC material by weight.

10. The method of claim 7, wherein the percentage of carbon is between about 5% to about 30% of the WBC material by weight.

11. The method of claim 1, wherein the hardmask layer comprises a tungsten containing material, wherein the tungsten containing material includes a percentage of tungsten greater than about 50% by weight.

12. The method of claim 1, wherein maintaining the device substrate at the cryogenic temperature further comprises:

maintaining the device substrate between about −10° C. to about −200° C.

13. The method of claim 1, wherein etching exposed portions of the hardmask layer further comprises:

exposing at least a portion of the cavity through the hardmask layer.

14. The method of claim 1, wherein providing radio frequency (RF) power to the etching gas mixture further comprises:

inductively coupling the RF power to the etching gas mixture.

15. The method of claim 1, wherein selectively etching exposed portions of the hardmask layer relative to the substrate reduces the throughput of the etch process.

* * * * *